(12) United States Patent
Cheng (10) Patent No.: US 12,443,113 B2
(45) Date of Patent: Oct. 14, 2025

(54) OVERLAY TARGET

(71) Applicant: United Microelectronics Corp., Hsinchu (TW)

(72) Inventor: Yu-Wei Cheng, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 527 days.

(21) Appl. No.: 17/979,765

(22) Filed: Nov. 3, 2022

(65) Prior Publication Data

US 2024/0111220 A1 Apr. 4, 2024

(30) Foreign Application Priority Data

Sep. 29, 2022 (TW) ................................. 111137003

(51) Int. Cl.
*G03F 7/00* (2006.01)
(52) U.S. Cl.
CPC ................................. *G03F 7/70633* (2013.01)

(58) Field of Classification Search
CPC ............. G03F 7/70633; G03F 7/70683; G03F 9/7076; G03F 9/7084; H01L 23/544; H01L 2223/54426
See application file for complete search history.

(56) References Cited

U.S. PATENT DOCUMENTS

| | | | |
|---|---|---|---|
| 2016/0093573 A1* | 3/2016 | Liou | H01L 23/53271 438/8 |
| 2018/0233419 A1* | 8/2018 | Liou | G03F 7/70633 |
| 2019/0101835 A1* | 4/2019 | Chen | G03F 7/70683 |
| 2019/0279841 A1* | 9/2019 | Xiao | H01J 37/28 |
| 2020/0219821 A1* | 7/2020 | Cheng | H01L 23/544 |
| 2020/0409271 A1* | 12/2020 | Hill | G03F 7/70683 |
| 2021/0072650 A1* | 3/2021 | Feler | G03F 7/70633 |
| 2021/0240089 A1* | 8/2021 | Golotsvan | G01N 21/47 |
| 2022/0415725 A1* | 12/2022 | Steely-Tarshish | H01L 22/34 |
| 2023/0092256 A1* | 3/2023 | Kobayashi | G03F 9/7076 438/401 |

* cited by examiner

*Primary Examiner* — Stewart A Fraser
(74) *Attorney, Agent, or Firm* — JCIPRNET (57) ABSTRACT

An overlay target that includes a plurality of working zones and a plurality of line segments. The line segments in each of the working zones have a plurality of widths and are parallel to each other.

18 Claims, 8 Drawing Sheets

OVERLAY TARGET

CROSS-REFERENCE TO RELATED APPLICATION

This application claims the priority benefit of Taiwan application serial no. 111137003, filed on Sep. 29, 2022. The entirety of the above-mentioned patent application is hereby incorporated by reference herein and made a part of this specification.

BACKGROUND

Technical Field

The disclosure relates to a semiconductor device and in particular relates to an overlay target of an overlay mark.

Description of Related Art

A lithography process is a patterning technology widely applied in a semiconductor manufacturing process. In the lithography process, a present layer and a previous layer are often aligned by applying an overlay mark. However, if the previous layer is not flat, it is unlikely to accurately calculate overlay errors.

SUMMARY

The disclosure provides an overlay target, which may serve to accurately measure overlay errors.

An embodiment of the disclosure provides an overlay target that includes a plurality of working zones and a plurality of line segments in each of the working zones. The line segments have a plurality of widths and are parallel to each other.

Another embodiment of the disclosure provides an overlay target that includes a plurality of working zones and a plurality of line segments in each of the working zones. The line segments are parallel to each other, and the greater a distance from the line segments to a center of the overlay target, the greater a width of the line segments.

In view of the above, the overlay target of the overlay mark provided in one or more embodiments of the disclosure may serve to accurately calculate overlay errors, so as to mitigate an impact resulting from the lack of surface flatness.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Reference is now made in detail to exemplary embodiments of the disclosure, and examples of the exemplary embodiments are described in the accompanying drawings. Whenever possible, the same reference numbers are used in the drawings and descriptions to indicate the same or similar parts.

Figure 1A:
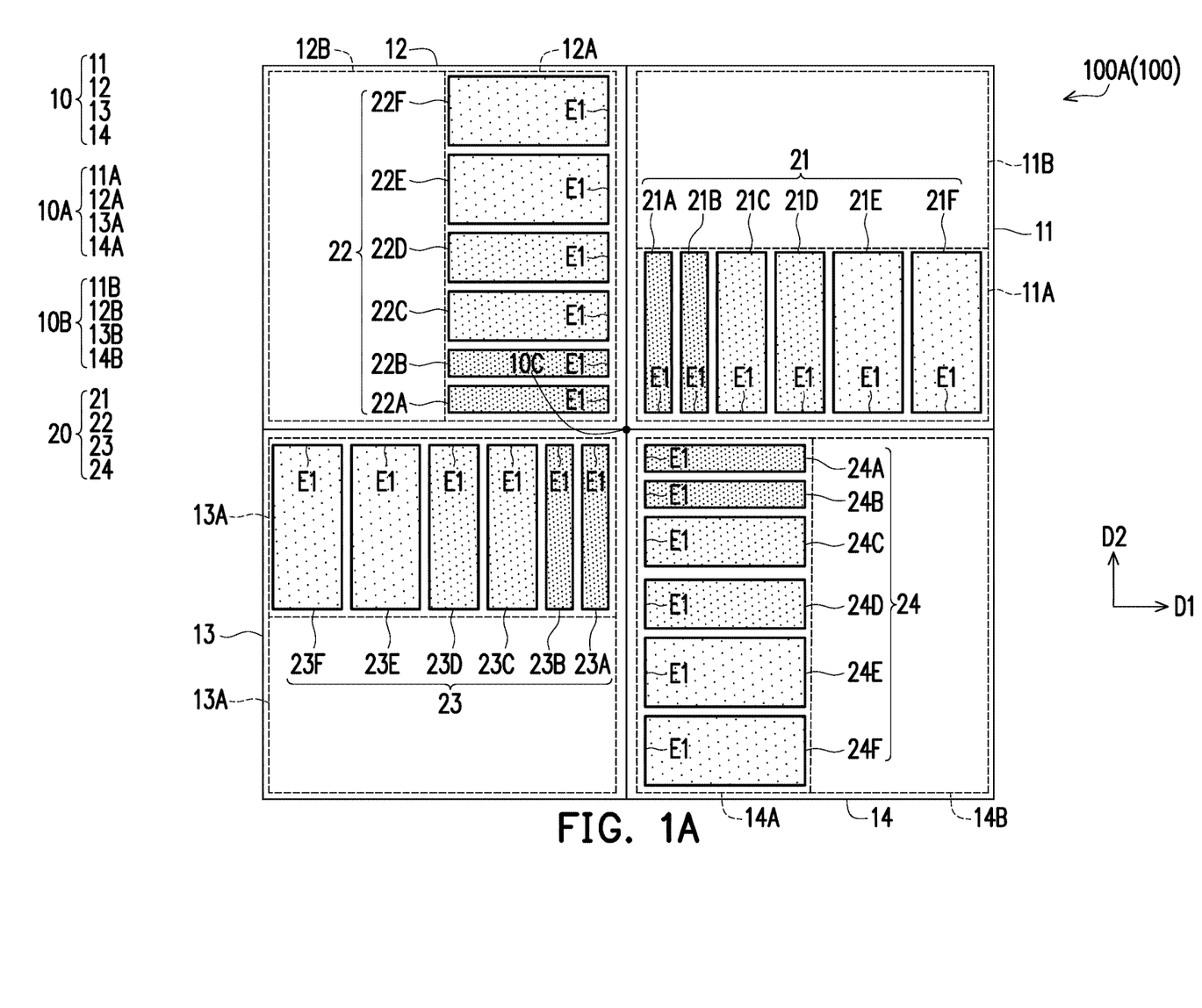
FIG. 1A is a top view of a first overlay target of an overlay mark according to an embodiment of the disclosure.
Figure 1B:
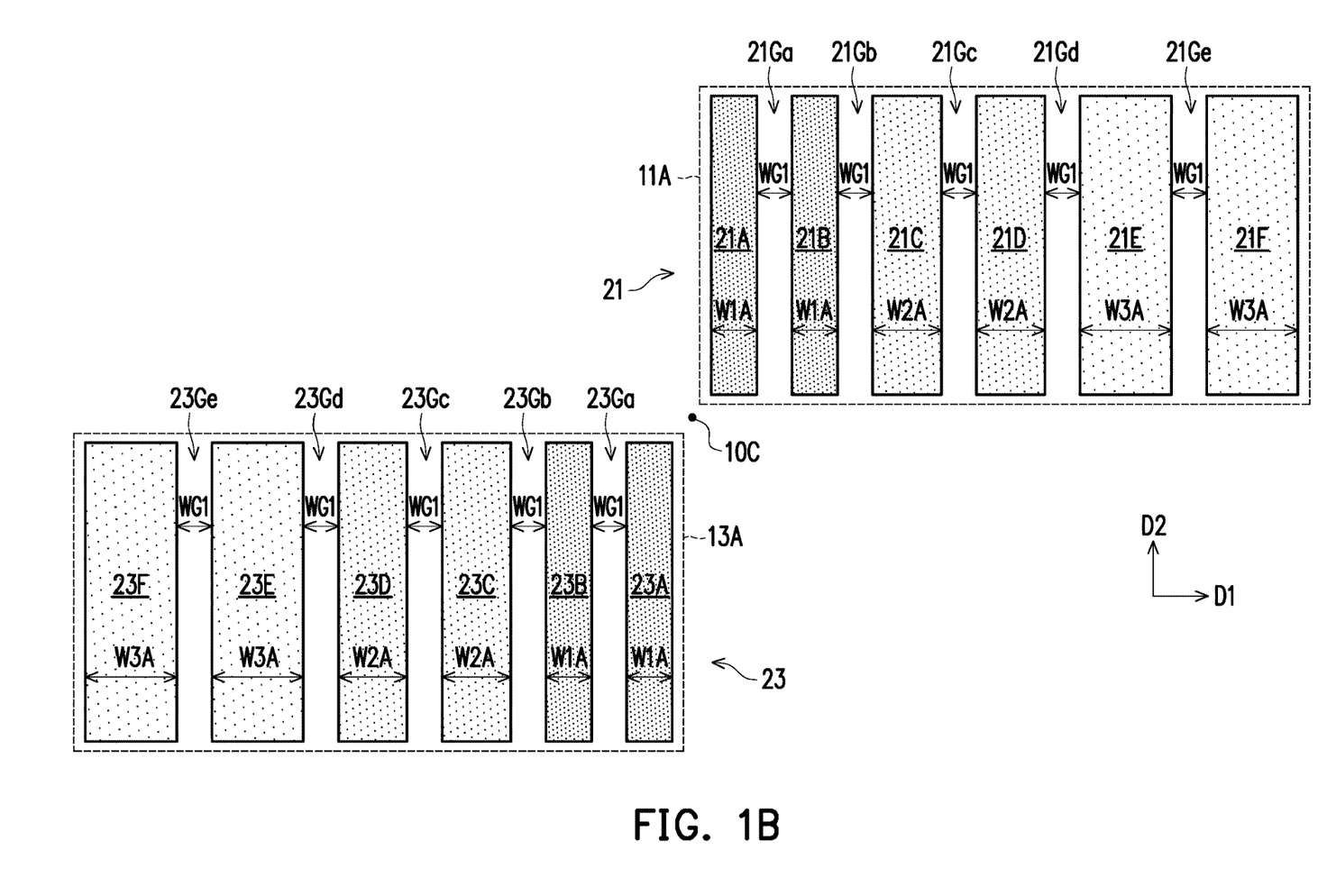
FIG. 1B is a partial enlarged view of a first working zone and a third working zone of the first overlay target depicted in FIG. 1A.
Figure 1C:
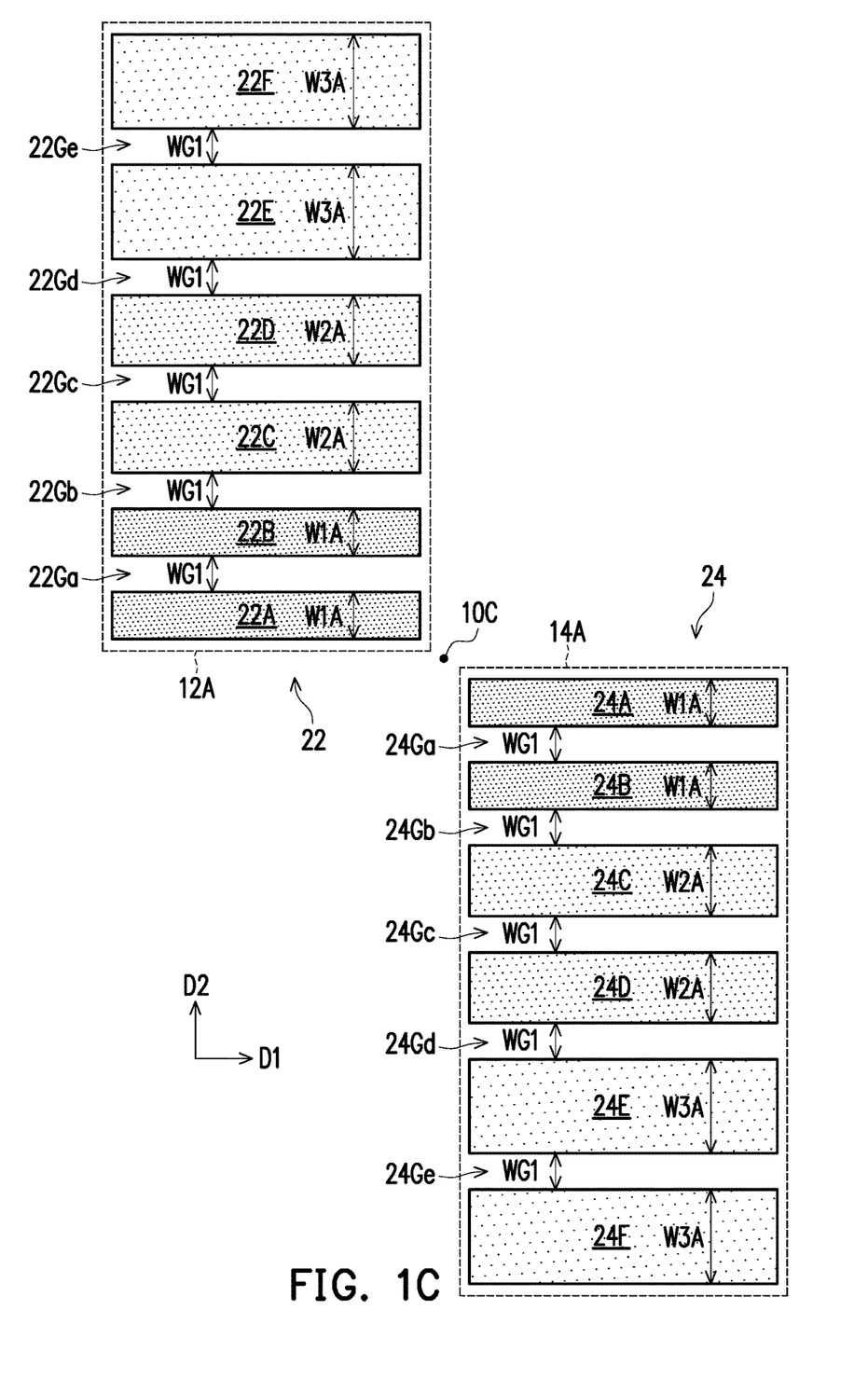
FIG. 1C is a partial enlarged view of a second working zone and a fourth working zone of the first overlay target depicted in FIG. 1A.

FIG. 1A is a top view of a first overlay target of an overlay mark according to an embodiment of the disclosure. FIG. 1B is a partial enlarged view of a first working zone and a third working zone of the first overlay target depicted in FIG. 1A. FIG. 1C is a partial enlarged view of a second working zone and a fourth working zone of the first overlay target depicted in FIG. 1A.

With reference to FIG. 1, an overlay mark 100 includes a first overlay target 100A, and the first overlay target 100A includes a plurality of working zones 10 and a plurality of line segments 20 in each of the working zones 10.

The working zones 10 of the first overlay target 100A includes a first working zone 11A, a second working zone 12A, a third working zone 13A, and a fourth working zone 14A which surround a center 10C of the first overlay target 100A, and the configuration of these working zones is rotationally symmetric. The first working zone 11A and the second working zone 12A are laterally adjacent to each other, the third working zone 13A and the fourth working zone 14A are laterally adjacent to each other, the third working zone 13A and the second working zone 12A are longitudinally adjacent to each other, and the fourth working zone 14A and the first working zone 11A are longitudinally adjacent to each other. Widths, lengths, and areas of the first working zone 11A, the second working zone 12A, the third working zone 13A, and the fourth working zone 14A may be approximately equal.

With reference to FIG. 1A and FIG. 1B, a plurality of line segments 20 include line segments 21, 22, 23, and 24, which are respectively located in the first working zone 11A, the second working zone 12A, the third working zone 13A, and the fourth working zone 14A. The line segments 20 of the first overlay target 100A may be rectangular strips. These rectangular strips are parallel and have approximately the same length but different widths. For instance, in some embodiments, the line segments 21 in the first working zone 11A include first line segments 21A and 21B and second line segments 21C and 21D. A length of the first line segment 21A/21B and a length of the second line segment 21C/21D are the same, but a width W1A of the first line segment 21A/21B and a width W2A of the second line segment 21C/21D are different. In some embodiments, the line segments 21 further include third line segments 21E and 21F, and the second line segment 21C/21D is sandwiched between the first line segment 21A/21B and the third line segment 21E/21F. A length of the third line segment 21E/21F is the same as the length of the first line segment 21A/21B and the length of the second line segment 21C/21D, but a width W3A of the third line segment 21E/21F is different from the width W1A of the first line segment 21A/21B and the width W2A of the second line segment 21C/21D. In other embodiments, the line segments 21 may further include more line segments of the same length but different widths.

With reference to FIG. 1A and FIG. 1C, similarly, the line segments 22 in the second working zone 12A include first line segments 22A and 22B, second line segments 22C and 22D, and third line segments 22E and 22F having the same length but different widths. With reference to FIG. 1A and FIG. 1B, the line segments 23 in the third working zone 13A include first line segments 23A and 23B, second line segments 23C and 23D, and third line segments 23E and 23F with the same length but different widths. With reference to FIG. 1A and FIG. 1C, the line segments 24 in the fourth working zone 14A include first line segments 24A and 24B, second line segments 24C and 24D, and third line segments 24E and 24F with the same length but different widths.

With reference to FIG. 1A, in some embodiments, the greater the distance from the line segments 20 to the center 10C of the first overlay target 100A, the greater the width of the line segments 20. With reference to FIG. 1C, for instance, the distance from the second line segments 21C, 21D, 22C, 22D, 23C 23D, 24C, and 24D to the center 10C is greater than the distance from the first line segments 21A, 21B, 22A, 22B, 23A 23B, 24A, and 24B to the center 10C, the second line segments 21C, 21D, 22C, 22D, 23C 23D, 24C, and 24D each have a second width W2A, and the second width W2A is greater than the first width W1A of each first line segment 21A, 21B, 22A 22B, 23A, 23B, 24A, and 24B. The distance from the third line segments 21E, 21F, 22E, 22F, 23E 23F, 24E, and 24F to the center 10C is greater than the distance from the second line segments 21C, 21D, 22C, 22D, 23C, 23D, 24C, and 24D to the center 10C, the third line segments 21E, 21F, 22E, 22F, 23E, 23F, 24E, 24F each have a third width W3A, and the third width W3A is greater than the second width W2A. In some embodiments, the first width W1A is the minimum width, and the third width W3A is the maximum width. A ratio of the third width W3A to the first width W1A is, for instance, equal to or greater than 2. For instance, the first width W1A: the second width W2A: the third width W3A=1:1.5:2, which should however not be construed as a limitation in the disclosure.

As shown in FIG. 1A to FIG. 1C, each of the working zones 10A (e.g., 11A, 12A, 13A, and 14A) of the first overlay target 100A includes two first line segments 21A and 21B, 22A and 22B, 23A and 23B, and 24A and 24B of the first width W1A, two second line segments 21C and 21D, 22C and 22D, 23C and 23D, and 24C and 24D of the second width W2A, and two third line segments 21E and 21F, 22E and 22F, 23E and 23F, and 24E and 24F of the third width W3A. The number of the line segments of the same width in each working zone may be one or more than two.

With reference to FIG. 1A and FIG. 1B, there are gaps 20G (i.e., 21G, 22G, 23G, and 24G) of the same width WG1 between the line segments 20 (i.e., 21, 22, 23, and 24) in each working zone 10A in the first overlay target 100A, which should however not be construed as a limitation in one or more embodiments of the disclosure. The gaps 21G (including gaps 21Ga, 21Gb, 21Gc, 21Gd, and 21Ge from the inside out) in the first working zone 11A in the first overlay target 100A and the gaps 23G (including gaps 23Ga, 23Gb, 23Gc, 23Gd, and 23Ge from the inside out) in the corresponding third working zone 13A in the first overlay target 100A respectively have a width WG1. The widths WG1 of the gaps 21G in the first working zone 11A may be equal to or different from each other; the widths WG1 of the gaps 23G in the third working zone 13A may be equal to or different from each other. However, the widths WG1 of the gaps 21G in the first working zone 11A and the widths WG1 of the gaps 23G in the corresponding third working zone 13A are equal.

With reference to FIG. 1A and FIG. 1C, the gaps 22G (including gaps 22Ga, 22Gb, 22Gc, 22Gd, and 22Ge from the inside out) in the second working zone 12A in the first overlay target 100A and the gaps 24G (including gaps 24Ga, 24Gb, 24Gc, 24Gd, and 24Ge from the inside out) in the corresponding fourth working zone 14A in the first overlay target 100A respectively have the width WG1. The widths WG1 of the gaps 22G in the second working zone 12A may be equal to or different from each other; the widths WG1 of the gaps 24G in the fourth working zone 14A may be equal to or different from each other. However, the widths WG1 of the gaps 22G in the second working zone 12A and the widths WG1 of the gaps 24G in the corresponding fourth working zone 14A are equal.

With reference to FIG. 1A, the line segments 21 in the first working zone 11A and the line segments 23 in the third working zone 13A extend along a direction D2 and are arranged along a direction D1. The line segments 22 in the second working zone 12A and the line segments 24 in the fourth working zone 14A extend along the direction D1 and are arranged along the direction D2. The direction D1 and the direction D2 are perpendicular to each other. In other words, the line segments 21 (including 21A to 21F) in the first working zone 11A are parallel to each other and parallel to the line segments 23 (including 23A to 23F) in the third working zone 13A. The line segments 22 (including 22A to 22F) in the second working zone 12A are parallel to each other and parallel to the line segments 24 (including 24A to 24F) in the fourth working zone 14A.

In some embodiments, the line segments 21A to 21F in the first working zone 11A and the line segments 23A to 23F in the third working zone 13A are symmetric with respect to the center 10C. The line segments 22A to 22F in the second working zone 12A and the line segments 24A to 24F in the fourth working zone 14A are symmetric with respect to the center 10C. In other words, the lengths, the widths, the number, and the arrangement of the line segments 21A to 21F in the first working zone 11A are the same as the lengths, the widths, the number, and the arrangement of the line segments 23A to 23F in the third working zone 13A. The lengths, the widths, the number, and the arrangement of the line segments 22A to 22F in the second working zone 12A are the same as the lengths, the widths, the number, and the arrangement of the of the line segments 24A to 24F in the fourth working zone 14A.

With reference to FIG. 1A, the line segments 21A to 21F in the first working zone 11A are perpendicular to the line segments 22A to 22F in the second working zone 12A laterally adjacent to the first working zone 11A and are perpendicular to the line segments 24A to 24F in the fourth working zone 14A below the second working zone 12A.

Similarly, the line segments 22A to 22F in the second working zone 12A are perpendicular to the line segments 21A to 21F in the first working zone 11A laterally adjacent to the second working zone 12A and are perpendicular to the line segments 23A to 23F in the third working zone 13A below the first working zone 11A. The line segments 23A to 23F in the third working zone 13A are perpendicular to the line segments 24A to 24F in the fourth working zone 14A laterally adjacent to the third working zone 13A and are perpendicular to the line segments 22A to 22F in the second working zone 12A above the fourth working zone 14A. The line segments 24A to 24F in the fourth working zone 14A are perpendicular to the line segments 23A to 23F in the third working zone 13A laterally adjacent to the fourth working zone 14A and are perpendicular to the line segments 21A to 21F in the first working zone 11A above the third working zone 13A.

Figure 2A:
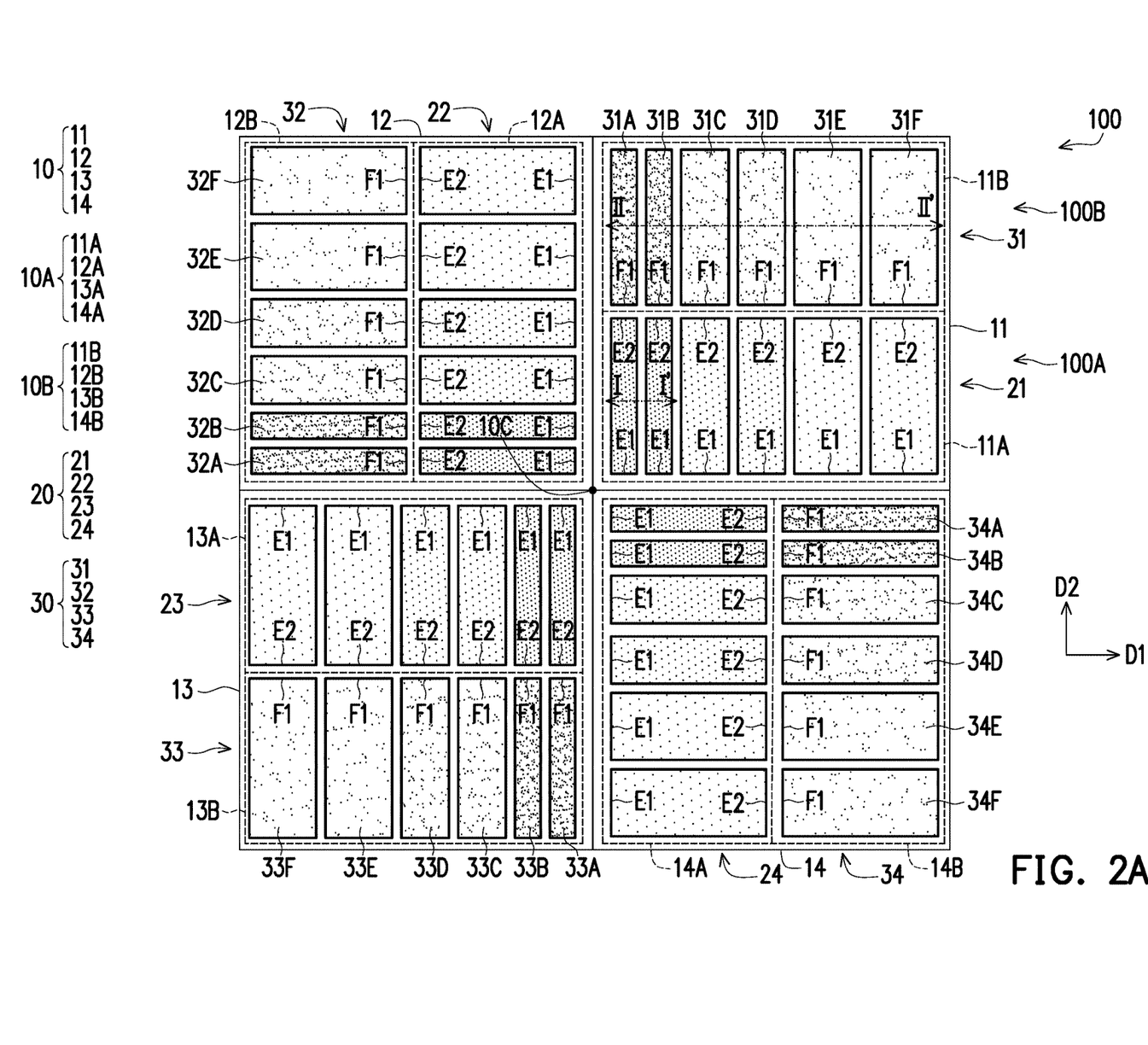
FIG. 2A is a top view of an overlay mark including the first overlay target and a second overlay target according to an embodiment of the disclosure.

With reference to FIG. 1A, the line segments 21A to 21F in the first working zone 11A of the first overlay target 100A have a plurality of end portions E1. In the first working zone 11A of the first overlay target 100A, the end portions E1 of the line segments 21A to 21D near the center 10C are adjacent to one side of the innermost line segment 24A in the fourth working zone 14A. In the first working zone 11A of the first overlay target 100A, the end portions E1 of the line segments 21E and 21F away from the center 10C are adjacent to one side of an innermost line segment 34A of line segments 34 in a fourth working zone 14B of a second overlay target 100B, as shown in FIG. 2A.

With reference to FIG. 1A, in the second working zone 12A of the first overlay target 100A, the end portions E1 of the line segments 22A to 22D near the center 10C are adjacent to one side of the innermost line segment 21A in the first working zone 11A. In the second working zone 12A of the first overlay target 100A, the end portions E1 of the line segments 22E and 22F away from the center 10C are adjacent to one side of an innermost line segment 31A of line segments 31 in a first working zone 11B of the second overlay target 100B, as shown in FIG. 2A.

With reference to FIG. 1A, in the third working zone 13A of the first overlay target 100A, the end portions E1 of the line segments 23A to 23D near the center 10C are adjacent to one side of the innermost line segment 22A in the second working zone 12A. In the third working zone 13A of the first overlay target 100A, the end portions E1 of the line segments 23E and 23F away from the center 10C are adjacent to one side of an innermost line segment 32A of line segments 32 in a second working zone 12B of the second overlay target 100B, as shown in FIG. 2A.

With reference to FIG. 1A, in the fourth working zone 14A of the first overlay target 100A, the end portions E1 of the line segments 24A to 24D near the center 10C are adjacent to one side of the innermost line segment 23A in the third working zone 13A. In the fourth working zone 14A of the first overlay target 100A, the end portions E1 of the line segments 24E and 24F away from the center 10C are adjacent to one side of an innermost line segment 33A of line segments 33 in a third working zone 13B of the second overlay target 100B, as shown in FIG. 2A.

Figure 2B:
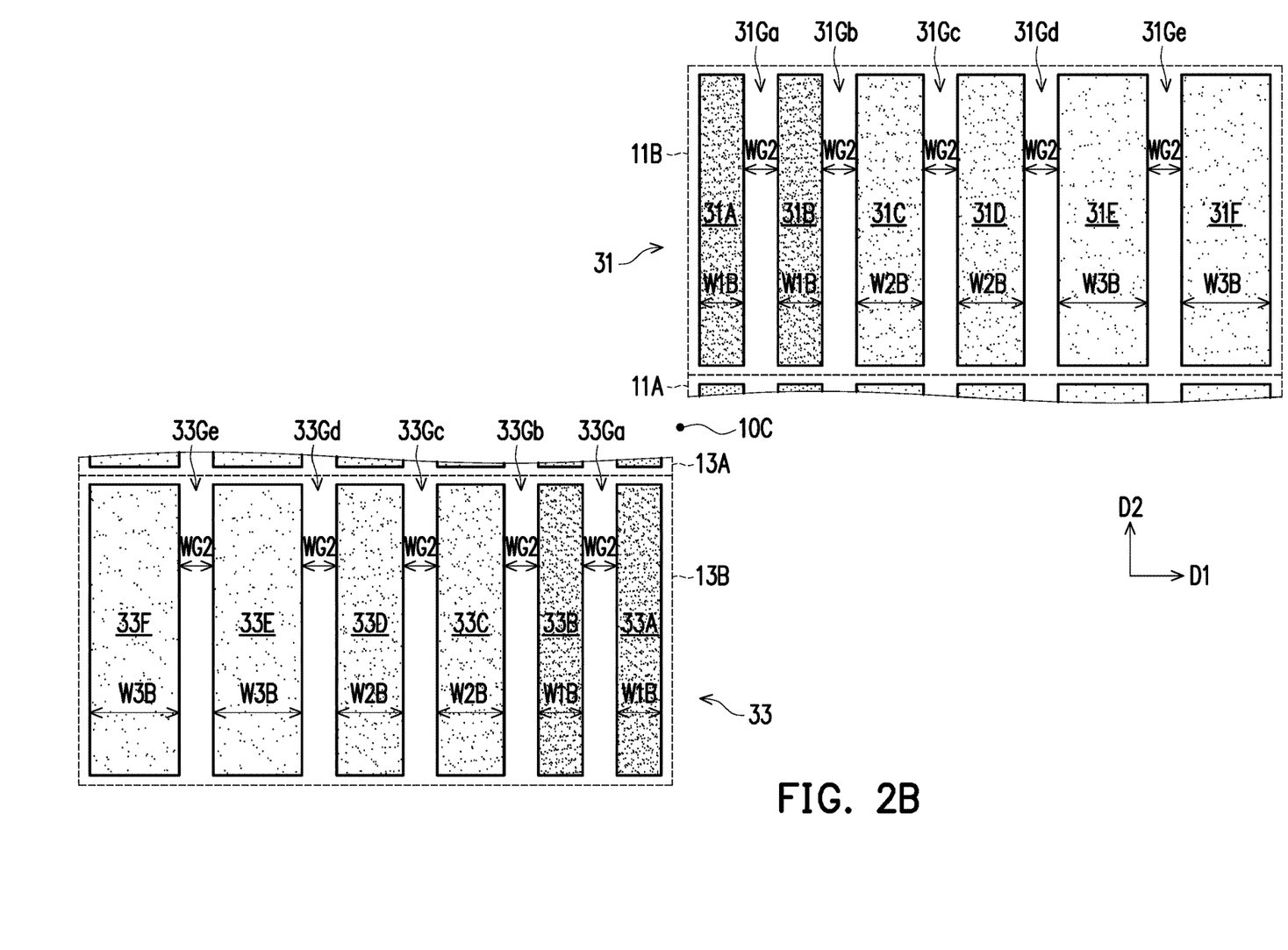
FIG. 2B is a partial enlarged view of a first working zone and a third working zone of the second overlay target depicted in FIG. 2A.
Figure 2C:
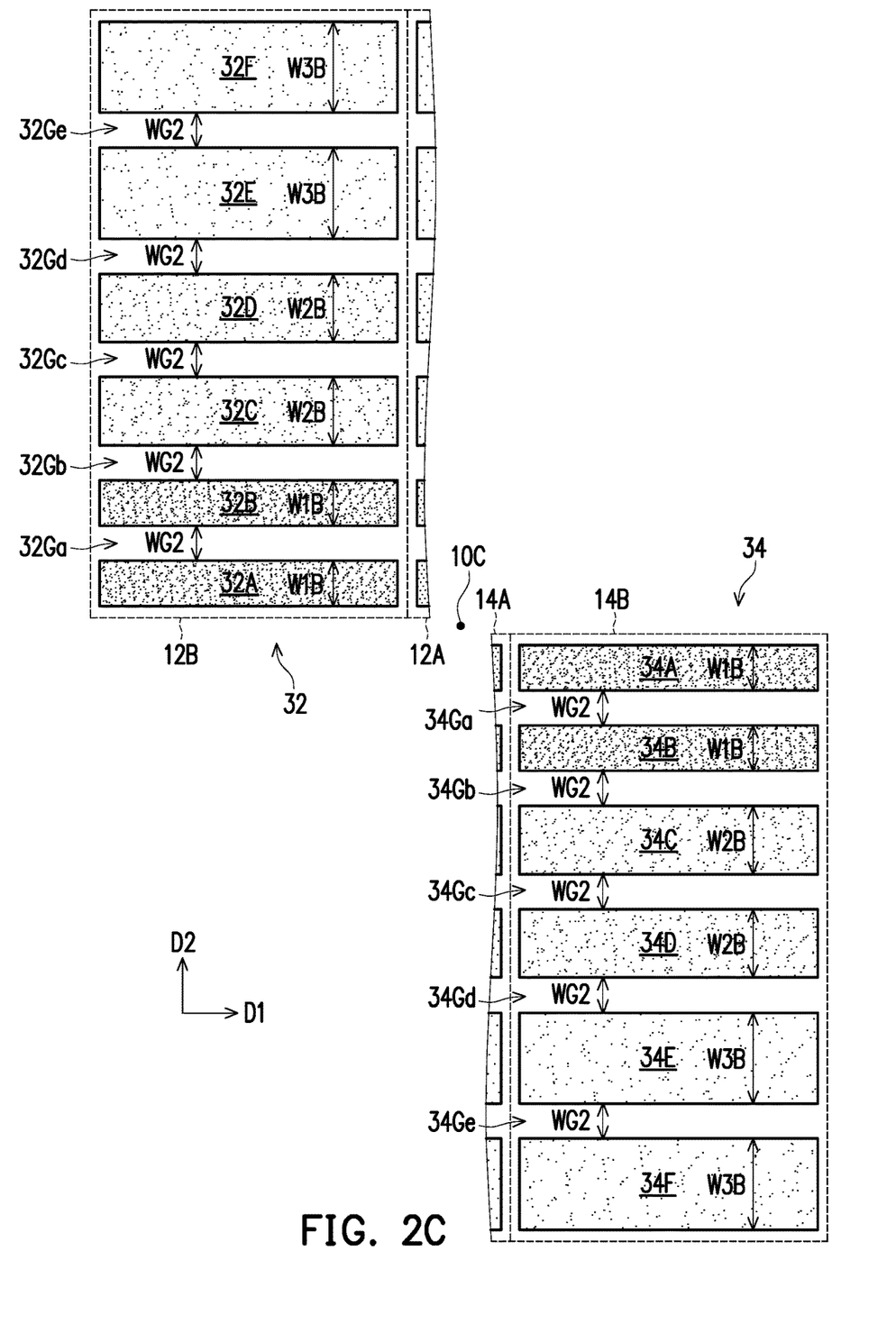
FIG. 2C is a partial enlarged view of a second working zone and a fourth working zone of the second overlay target depicted in FIG. 2A.

FIG. 2A is a top view of an overlay mark according to an embodiment of the disclosure. FIG. 2B is a partial enlarged view of a first working zone and a third working zone of the second overlay target depicted in FIG. 2A. FIG. 2C is a partial enlarged view of a second working zone and a fourth working zone of the second overlay target depicted in FIG. 2A.

With reference to FIG. 2A, in some embodiments, the overlay mark 100 further includes the second overlay target 100B. The second overlay target 100B is adjacent to the first overlay target 100A. The first overlay target 100A may be configured to act as a present layer of a semiconductor device. The second overlay target 100B may be configured to act as a previous layer of the semiconductor device.

The second overlay target 100B may be similar to the first overlay target 100A. The second overlay target 100B includes a plurality of working zones 10B and a plurality of line segments 30 in each of the working zones 10B. The working zones 10B of the second overlay target 100B surround the center 10C of the overlay mark 100.

In some embodiments, a configuration of the working zones 10B is rotationally symmetric. For instance, the working zones 10B of the second overlay target 100B include a first working zone 11B, a second working zone 12B, a third working zone 13B, and a fourth working zone 14B. The first working zone 11B is longitudinally adjacent to the first working zone 11A, and the first working zones 11A and 11B together constitute a first zone 11. The second working zone 12B is longitudinally adjacent to the second working zone 12A, and the second working zones 12A and 12B together constitute a second zone 12. The third working zone 13B is longitudinally adjacent to the third working zone 13A, and the third working zones 13A and 13B together constitute a third zone 13. The fourth working zone 14B is laterally adjacent to the fourth working zone 14A, and the fourth working zones 14A and 14B together constitute a fourth zone 14. Widths, lengths, and areas of the first working zone 11B, the second working zone 12B, the third working zone 13B, and the fourth working zone 14B may be substantially equal. Widths, lengths, and areas of the first zone 11, the second zone 12, the third zone 13, and the fourth zone 14 may be substantially equal, and configurations thereof are rotationally symmetric.

Line segments 30 in the second overlay target 100B are rectangular strips. The line segments 30 in the same working zone 10B are parallel to each other and have substantially the same length. The line segments 30 include line segments 31, 32, 33, and 34, which are located in the first working zone 11B, the second working zone 12B, the third working zone 13B, and the fourth working zone 14B, respectively. The line segments 31 include line segments 31A to 31F, the line segments 32 include line segments 32A to 32F, the line segments 33 include line segments 33A to 33F, and the line segments 34 include line segments 34A to 34F. The lengths, the widths, the number, and the arrangement of the line segments 31A to 31F may be similar to the lengths, the widths, the number, and the arrangement the line segments 21A to 21F, respectively. The lengths, the widths, the number, and the arrangement of the line segments 32A to 32F may be similar to the lengths, the widths, the number, and the arrangement of the line segments 22A to 22F, respectively. The lengths, the widths, the number, and the arrangement of the line segments 33A to 33F may be similar to the lengths, the widths, the number, and the arrangement of the line segments 23A to 23F, respectively. The lengths, the widths, the number, and the arrangement of the line segments 34A to 34F may be similar to the lengths, the widths, the number, and the arrangement of the line segments 24A to 24F, respectively, which should however not be construed as a limitation in one or more embodiments of the disclosure.

In some embodiments, each of the working zones 10B (e.g., 11B, 12B, 13B, and 14B) in the second overlay target 100B includes two first line segments 31A and 31B, 32A and 32B, 33A and 33B, and 34A and 34B of a first width W1B, two second line segments 31C and 31D, 32C and 32D, 33C and 33D, and 34C and 34D of a second width W2B, and two third line segments 31E and 31F, 32E and 32F, 33E and 33F, and 34E and 34F of a third width W3B, which should however not be construed as a limitation in one or more embodiments of the disclosure, and the number of the line segments of the same width in each working zone may be one or more than two.

With reference to FIG. 2A to FIG. 2C, there are gaps 30G (i.e., 31G, 32G, 33G, and 34G) of the same width WG2 between the line segments 30 (i.e., 31, 32, 33, 34) in each working zone 10A in the second overlay target 100B, which should however not be construed as a limitation in one or more embodiments of the disclosure. The gaps 31G (including gaps 31Ga, 31Gb, 31Gc, 31Gd, and 31Ge from the inside out) in the first working zone 11B in the second overlay target 100B and the gaps 33G (including gaps 33Ga, 33Gb, 33Gc, 33Gd, and 33Ge from the inside out) in the corresponding third working zone 13B in the second overlay target 100B have the same width WG2, respectively.

With reference to FIG. 2A and FIG. 2C, the gaps 32G (including gaps 32Ga, 32Gb, 32Gc, 32Gd, and 32Ge from the inside out) in the second working zone 12B in the second overlay target 100B and the gaps 34G (including gaps 34Ga, 34Gb, 34Gc, 34Gd, and 34Ge from the inside out) in the corresponding fourth working zone 14B in the second overlay target 100B have the same width WG2, respectively.

The line segments 31 and 33 in the first working zone 11B and the third working zone 13B extend along the direction D2 and are arranged along the direction D1. The line segments 32 and 34 in the second working zone 12B and the fourth working zone 14B extend along the direction D1 and are arranged along the direction D2. The direction D1 and the direction D2 are perpendicular to each other. In other words, the line segments 31 in the first working zone 11B are parallel to each other and parallel to the line segments 33 in the third working zone 13B. The line segments 32 in the second working zone 12B are parallel to each other and parallel to the line segments 34 in the fourth working zone 14B.

The line segments 31 in the first working zone 11B are perpendicular to the line segments 32 in the second working zone 12B and perpendicular to the line segments 34 in the fourth working zone 14B below the first working zone 11B. Similarly, the line segments 32 in the second working zone 12B are perpendicular to the line segments 31 in the first working zone 11B laterally adjacent to the second working zone 12B and are perpendicular to the line segments 33 in the third working zone 13B below the second working zone 12B. The line segments 33 in the third working zone 13B are perpendicular to the line segments 34 in the fourth working zone 14B laterally adjacent to the third working zone 13B and perpendicular to the line segments 32 in the second working zone 12B above the third working zone 13B. The line segments 34 in the fourth working zone 14B are perpendicular to the line segments 33 in the third working zone 13B laterally adjacent to the fourth working zone 14B and perpendicular to the line segments 31 in the first working zone 11B above the fourth working zone 14B.

With reference to FIG. 2A, a plurality of end portions F1 of the line segments 30 in the working zone 10B in the second overlay target 100B are adjacent to the end portions E2 of the line segments 20 in the corresponding working zone 10A in the first overlay target 100A.

Figure 3A:
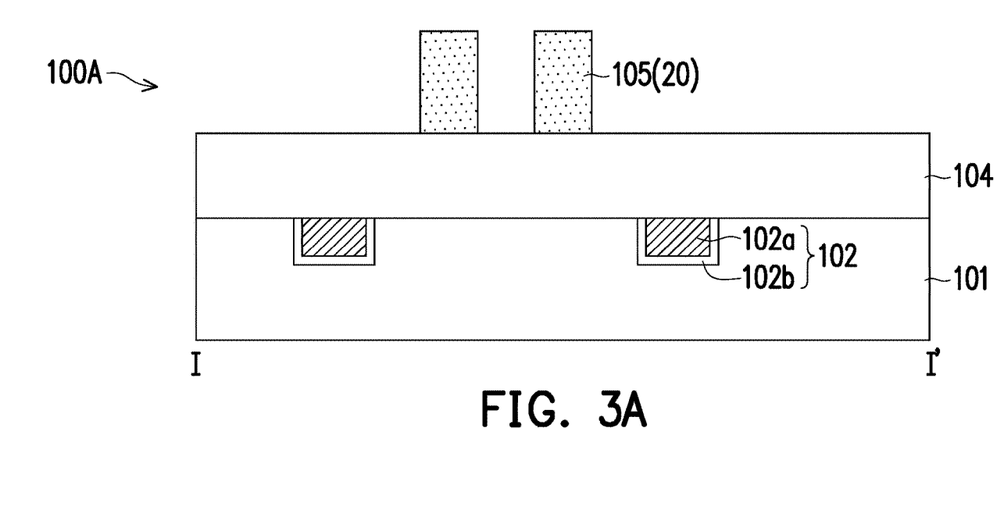
FIG. 3A is a cross-sectional view of a first overlay target of an overlay mark taken along the line I-I' in FIG. 2A.
Figure 3B:
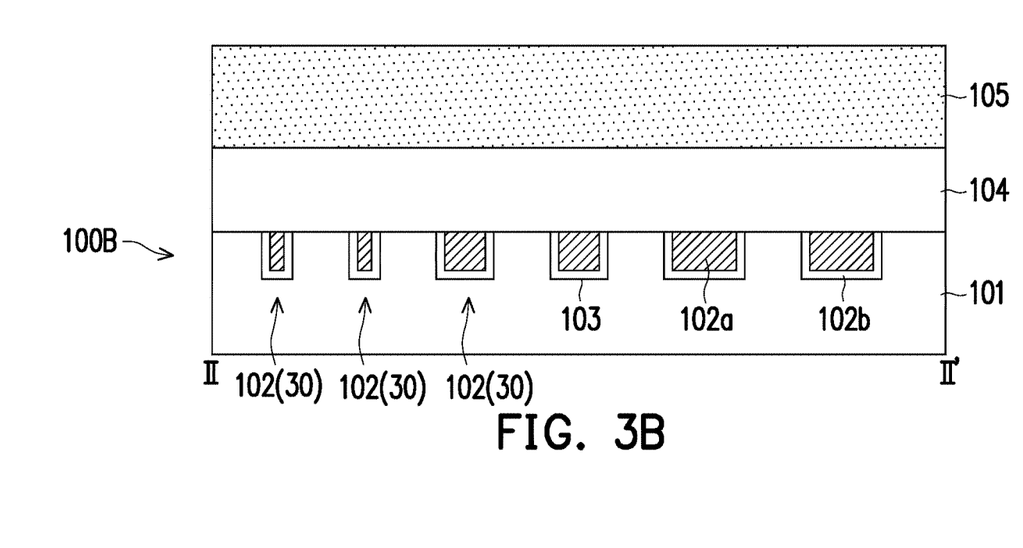
FIG. 3B is a cross-sectional view of a second overlay target of the overlay mark taken along the line II-II' in FIG. 2A.
Figure 4A:
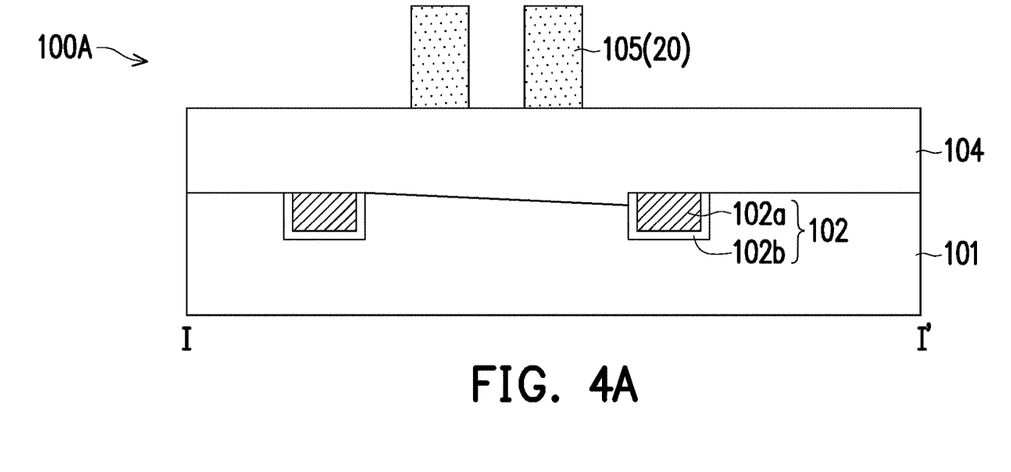
FIG. 4A is a cross-sectional view of a first overlay target of another overlay mark taken along the line I-I' in FIG. 2A.
Figure 4B:
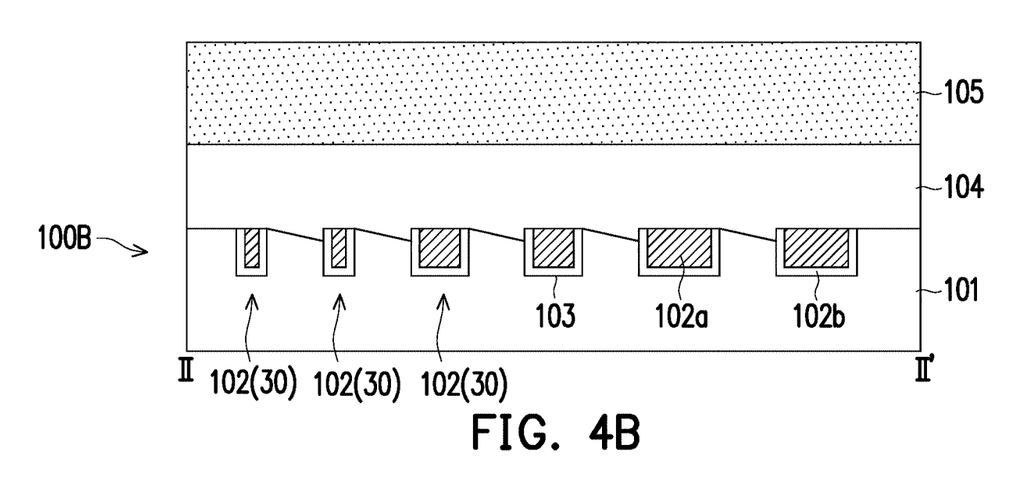
FIG. 4B is a cross-sectional view of a second overlay target of the another overlay mark taken along the line II-II' in FIG. 2A.

FIG. 3A is a cross-sectional view of a first overlay target of an overlay mark taken along the line I-I' in FIG. 2A. FIG. 3B is a cross-sectional view of a second overlay target of the overlay mark taken along the line II-II' in FIG. 2A. FIG. 4A is a cross-sectional view of a first overlay target of another overlay mark taken along the line I-I' in FIG. 2A. FIG. 4B is a cross-sectional view of a second overlay target of the another overlay mark taken along the line II-II' in FIG. 2A.

With reference to FIG. 3A and FIG. 3B, in some embodiments, the line segments 20 in the first overlay target 100A serve as the present layer. The present layer is constituted by photoresist patterns 105. The line segments 30 of the second overlay target 100B serve as the previous layer. The previous layer is the second layer 102 formed in grooves 103 of the first layer 101 below the photoresist patterns 105. A material layer 104 is located between the photoresist patterns 105 and the first layer 101.

The first layer 101 includes a dielectric material, e.g., silicon oxide, silicon nitride, aluminum oxide, silicon oxynitride, a low-k material, or a combination thereof. A dielectric constant of the low-k material is, for instance, lower than 4. The second layer 102 may be a filler layer filling the grooves 103. The filler layer includes a metal filler layer 102$a$ or further includes a barrier layer or an adhesion layer 102$b$, which is interposed between the first insulation layer 101 and the metal filler layer 102$a$. The metal filler layer 102$a$ is, for instance, copper, tungsten, aluminum, or an alloy thereof. The barrier layer or the adhesion layer 102$b$ includes metal, metal nitride, or a combination thereof. Specifically, the barrier layer or the adhesion layer 102$b$ is, for instance, titanium, tantalum, titanium nitride, tantalum nitride, or a combination thereof. The material layer 104 is going to be patterned in the subsequent manufacturing process. Here, the material layer 104 may be referred to as a to-be-patterned layer. The material layer 104 may be another dielectric material, such as silicon oxide, silicon nitride, aluminum oxide, silicon oxynitride, a low-k material, or a combination thereof, which should however not be construed as a limitation in the disclosure. The dielectric constant of the low-k material is, for instance, lower than 4. The second layer 102 is, for instance, planarized by performing a chemical mechanical polishing process. In some embodiments, after the planarization process, surfaces of the first layer 101 and the second layer 102 are levelled and substantially aligned to each other, which indicates the ideal planarization of the planarized layer.

With reference to FIG. 4A and FIG. 4B, in some embodiments, due to the impact resulting from the manufacturing process, the machine, or other factors, after the planarization process, the first layer 101 has a plurality of slightly inclined surfaces. Each surface of the first layer 101 has one end (or one side) levelled and substantially aligned to the surface of the second layer 102, and the other end of each surface of the first layer 101 is lower than the surface of the second layer 102.

By contrast, as shown in FIG. 3A and FIG. 3B, the surfaces of the first layer 101 and the second layer 102 are levelled and substantially aligned to each other, and thus it is not necessary to take the noise impact caused by the non-level and unaligned surfaces on the line segments into consideration. It is assumed that an actual overlay shift a is generated when the alignment is performed in an X direction, an actual overlay shift b is generated when the alignment is performed in a Y direction, and noise overlay resulting from the machine itself, the manufacturing process, or other factors is m. The calculation of the overlay error by applying the overlay mark 100 provided in one or more embodiments of the disclosure is described below. However, the following calculations are exemplified for easy understanding, while the actual calculations may be more complicated.

With reference to FIG. 2A, through a plurality of center points of optical signals of the first line segments 21A, 21B, 23A, and 23B of the first width W1A in the first working zone 11A and the third working zone 13A and a plurality of center points of optical signals of the first line segments 31A, 31B, 33A, and 33B of the first width W1B in the first working zone 11B and the third working zone 13B, an offset in the X direction may be obtained (AA_X1=a+m). Through a plurality of center points of the optical signals of the second line segments 21C, 21D, 23C, and 23D of the second width W2A in the first working zone 11A and the third working zone 13A and a plurality of center points of the optical signals of the second line segments 31C, 31D, 33C, and 33D of the second width W2B in the first working zone 11B and the third working zone 13B, an offset in the X direction may be obtained (AA_X2=a+m). Through a plurality of center points of the optical signals of the third line segments 21E, 21F, 23E, and 23F of the third width W3A in the first working zone 11A and the third working zone 13A and a plurality of center points of the optical signals of the third line segments 31E, 31F, 33E, and 33F of the third width W3B in the first working zone 11B and the third working zone 13B, an offset in the X direction may be obtained (AA_X3=a+m). That is, AA_X3=AA_X2=AA_X1.

Similarly, an offset (AA_Y1=b+m) obtained in the Y direction through the first line segments 22A, 22B, 24A, 24B, 32A, 32B, 34A, and 34B of the first width W1A/W1B in the second working zone 12A/12B and the fourth working zone 14A/14B is equal to an offset (AA_Y2=b+m) obtained in the Y direction through the second line segments 22C, 22D, 24C, 24D, 32C, 32D, 34C, and 34D of the second width W2A/W2B in the second working zone 12A/12B and the fourth working zone 14A/14B and equal to an offset (AA_Y3=b+m) obtained in the Y direction through the third line segments 22E, 22F, 24E, 24F, 32E, 32F, 34E, and 34F of the third width W3A/W3B in the second working zone 12A/12B and the fourth working zone 14A/14B. Since the surfaces of the first layer 101 and the second layer 102 are levelled and substantially aligned to each other, there is no noise impact resulting from the non-level surfaces on the line segments; therefore, AA_Y3=AA_Y2=AA_Y1.

As shown in FIG. 4A and FIG. 4B, the surfaces of the first layer 101 and the second layer 102 are not levelled and aligned, and the first layer 101 has a plurality of inclined surfaces. It is assumed the actual overlay shift a is generated when the alignment is performed in the X direction, and the actual overlay shift b is generated when the alignment is performed in the Y direction. The noise overlay between the first line segments 31A and 33A or between the first line segments 31B and 33B due to the machine itself, the manufacturing process, the non-level and unaligned surfaces of the first layer 101 and the second layer 102, and other factors is n. The calculation of the overlay error by applying the overlay mark 100 provided in one or more embodiments of the disclosure is described below. However, the following calculations are exemplified for easy understanding, while the actual calculations may be more complicated.

Due to the relatively large width, the third line segments 21E, 21F, 23E, 23F, 31E, 31F, 33E, and 33F of the third width W3A/W3B in the first working zone 11A/11B and the third working zone 13A/13B obtain in the X direction an offset (AA_X3) greater than an offset (AA_X2) obtained in the X direction through the second line segments 21C, 21D, 23C, 23D, 31C, 31D, 33C, and 33D of the second width W2A/W2B in the first working zone 11A/11B and the third working zone 13A/13B and even greater than an offset (AA_X1) obtained in the X direction through the first line segments 21A, 21B, 23A, 23B, 31A, 31B, 33A, and 33B of the first width W1A/W1B in the first working zone 11A/11B and the third working zone 13A/13B; namely, AA_X3>AA_X2>AA_X1.

For instance, given that the third width W3B: the second width W2B: the first width W1B=2:1.5:1, it is assumed that the noise overlay resulting from the machine itself, the manufacturing process, the non-level and unaligned surfaces of the first layer 101 and the second layer 102, and other factors and affecting the first line segments 21A, 21B, 23A, 23B, 31A, 31B, 33A, and 33B is n, the noise overlay affecting the second line segments 21C, 21D, 23C, 23D, 31C, 31D, 33C, and 33D is n*1.5, and the noise overlay affecting the third line segments 21E, 21F, 23E, 23F, 31E, 31F, 33E, and 33F is n*2. Therefore, AA_X3=a+n*2, AA_X2=a+n*1.5, AA_X1=a+n*1. In addition, the noise between the line segments may be further considered. The noise Shift X1X2 between the first line segments and the second line segments is AA_X2-AA_X1, the noise Shift X2X3 between the second line segments and the third line segments is AA_X3-AA_X2, and the noise Shift X1X3 between the first line segments and the third line segments is AA_X3-AA_X1. The average noise Avg Shift X of the first line segments, the second line segments, and the third line segments is ⅓*(Shift X1X2+Shift X2X3+Shift X1X3). Therefore, the correct overlay error may be calculated as (AA_X1)–average noise Avg Shift X. Here, the calculation is performed by AA_X1 because it is assumed that the offset obtained through the first line segments is closest to an offset obtained in the actual X direction.

Similarly, an offset (AA_Y3) obtained in the Y direction through the third line segments 22E, 22F, 24E, 24F, 32E, 32F, 34E, and 34F of the third width W3A/W3B in the second working zone 12A/12B and the fourth working zone 14A/14B is greater than an offset (AA_Y2) obtained in the Y direction through the second line segments 22C, 22D, 24C, 24D, 32C, 32D, 34C, and 34D of the second width W2A/W2B in the second working zone 12A/12B and the fourth working zone 14A/14B and even greater than an offset (AA_Y1) obtained in the Y direction through the first line segments 22A, 22B, 24A, 24B, 32A, 32B, 34A, and 34B of the first width W1A/W1B in the second working zone 12A/12B and the fourth working zone 14A/14B. That is, AA_Y3>AA_Y2>AA_Y1. For instance, if the third width W3B: the second width W2B: the first width W1B=2:1.5:1, then AA_Y3=b+n*2, AA_Y2=b+n*1.5, and AA_Y1=b+n*1.

In addition, the noise between the line segments may be further considered. The noise Shift Y1Y2 between the first line segments and the second line segments is AA_Y2-AA_Y1, the noise Shift Y2Y3 between the second line segments and the third line segments is AA_Y3-AA_Y2, and the noise Shift Y1Y3 between the first line segments and the third line segments is AA_Y3-AA_Y1. The average noise Avg Shift Y of the first line segments, the second line segments, and the third line segments is ⅓*(Shift Y1Y2+Shift Y2Y3+Shift Y1Y3). Therefore, the correct Y overlay error may be calculated as (AA_Y1)–average noise Avg Shift Y. Here, the calculation is performed by AA_Y1 because it is assumed that the offset obtained through the first line segments is closest to an offset obtained in the actual Y direction.

In other words, through modifying the widths of the line segments to various widths by the first overlay target provided in one or more embodiments of the disclosure, errors resulting from the non-level and unaligned surfaces may be effectively amplified to calculate the correct overlay error. Therefore, the overlay mark provided in one or more embodiments of the disclosure may be applied to accurately measure the overlay error, so as to avoid incorrect calculation of the overlay error due to the non-level and unaligned surfaces.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An overlay target, comprising:
a plurality of working zones; and a plurality of line segments in each of the working zones, wherein in each of the working zones, the plurality of line segments are parallel to each other in an arrangement direction, have a plurality of widths in the arrangement direction, and have the same length in an extension direction perpendicular to the arrangement direction; wherein the overlay target has a center, and the working zones surround the center; and wherein the line segments comprise a first line segment and a second line segment, the second line segment is farther from the center than the first line segment, the second line segment has a second width, and the second width is greater than a first width of the first line segment.

2. The overlay target according to claim 1, wherein a configuration of the working zones is rotationally symmetric.

3. The overlay target according to claim 1, wherein the line segments comprise a third line segment, and the second line segment is sandwiched between the first line segment and the third line segment.

4. The overlay target according to claim 3, wherein the third line segment has a third width greater than the second width.

5. The overlay target according to claim 4, wherein a ratio of the third width to the first width is greater than or equal to 2.

6. The overlay target according to claim 1, wherein, the working zones comprise a first working zone and a second working zone laterally adjacent to the first working zone, and the line segments in the first working zone are perpendicular to the line segments in the second working zone.

7. The overlay target according to claim 6, wherein the working zones further comprise a third working zone and a fourth working zone laterally adjacent to each other, wherein the third working zone is longitudinally adjacent to the second working zone, the fourth working zone is longitudinally adjacent to the first working zone, and the line segments in the third working zone are perpendicular to the line segments in the fourth working zone.

8. The overlay target according to claim 7, wherein the line segments in the first working zone are parallel to the line segments in the third working zone, and the line segments in the second working zone are parallel to the line segments in the fourth working zone.

9. The overlay target according to claim 7, wherein the line segments in the first working zone have a plurality of end portions adjacent to one side of an innermost line segment of the line segments in the fourth working zone.

10. An overlay target, comprising:
a plurality of working zones; and
a plurality of line segments in each of the working zones, wherein in each of the working zones, the plurality of line segments are parallel to each other in an arrangement direction, have a plurality of widths in the arrangement direction, have the same length in an extension direction perpendicular to the arrangement direction, and the greater a distance from the line segments to a center of the overlay target, the greater a width of the line segments.

11. The overlay target according to claim 10, wherein a configuration of the working zones is rotationally symmetric.

12. The overlay target according to claim 10, wherein the working zones comprise a first working zone and a second working zone adjacent to the first working zone, and the line segments in the first working zone are perpendicular to the line segments in the second working zone.

13. The overlay target according to claim 12, wherein the working zones comprise a third working zone and a fourth working zone which is adjacent to the second working zone, the line segments in the first working zone are parallel to the line segments in the third working zone, and the line segments in the second working zone are parallel to the line segments in the fourth working zone.

14. The overlay target according to claim 13, wherein the line segments in the first working zone and the line segments in the third working zone are center-symmetric, and the line segments in the second working zone and the line segments in the fourth working zone are center-symmetric.

15. The overlay target according to claim 10, wherein the line segments in a same working zone of the working zones have a same length.

16. The overlay target according to claim 10, wherein the line segments are second layers filling a plurality of grooves in a first layer.

17. The overlay target according to claim 16, wherein the second layer comprises a metal layer.

18. The overlay target according to claim 16, wherein the second layer is planarized by performing a chemical mechanical polishing process.

* * * * *